United States Patent [19]
Wimmer et al.

[11] 4,196,345
[45] Apr. 1, 1980

[54] OPERATING PARAMETER SELECTION AND ENTRY DEVICE

[75] Inventors: Guenther W. Wimmer, Portland; Douglas B. Bingham, Sherwood, both of Oreg.

[73] Assignee: Tektronix, Inc., Beaverton, Oreg.

[21] Appl. No.: 912,119

[22] Filed: Jun. 2, 1978

[51] Int. Cl.² .................. G06K 7/00; G06K 21/00; G06C 11/10
[52] U.S. Cl. .................... 235/435; 235/489; 235/433
[58] Field of Search ............... 364/900, 464; 235/433, 235/432, 383, 385, 489, 435

[56] References Cited
U.S. PATENT DOCUMENTS

| | | | |
|---|---|---|---|
| 3,114,036 | 12/1963 | Andregg | 235/489 |
| 3,550,290 | 12/1970 | Azure | 35/48 B |
| 3,609,880 | 10/1971 | Arbon | 235/489 |
| 3,656,243 | 4/1972 | Segal | 35/48 B |
| 3,751,637 | 8/1973 | Dillon | 235/433 |
| 4,051,608 | 10/1977 | Duncan | 235/489 |

Primary Examiner—Robert M. Kilgore
Attorney, Agent, or Firm—William D. Haffner

[57] ABSTRACT

A parameter entry device for electronic instruments that also displays the current user definable system parameters is described. This device allows the user to change those parameters without using conventional rotary switches, internal straps, jumpers, etc.

5 Claims, 4 Drawing Figures

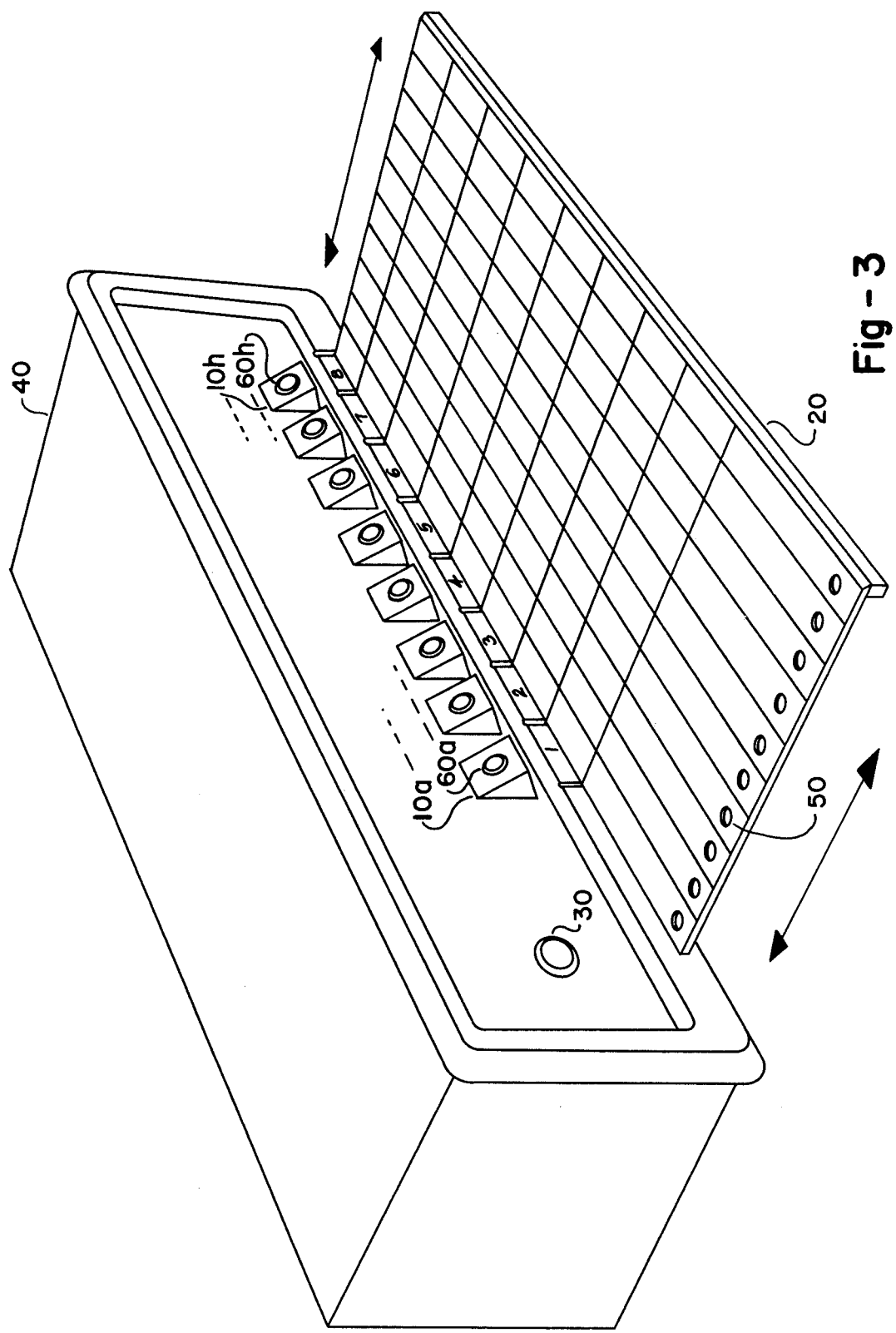

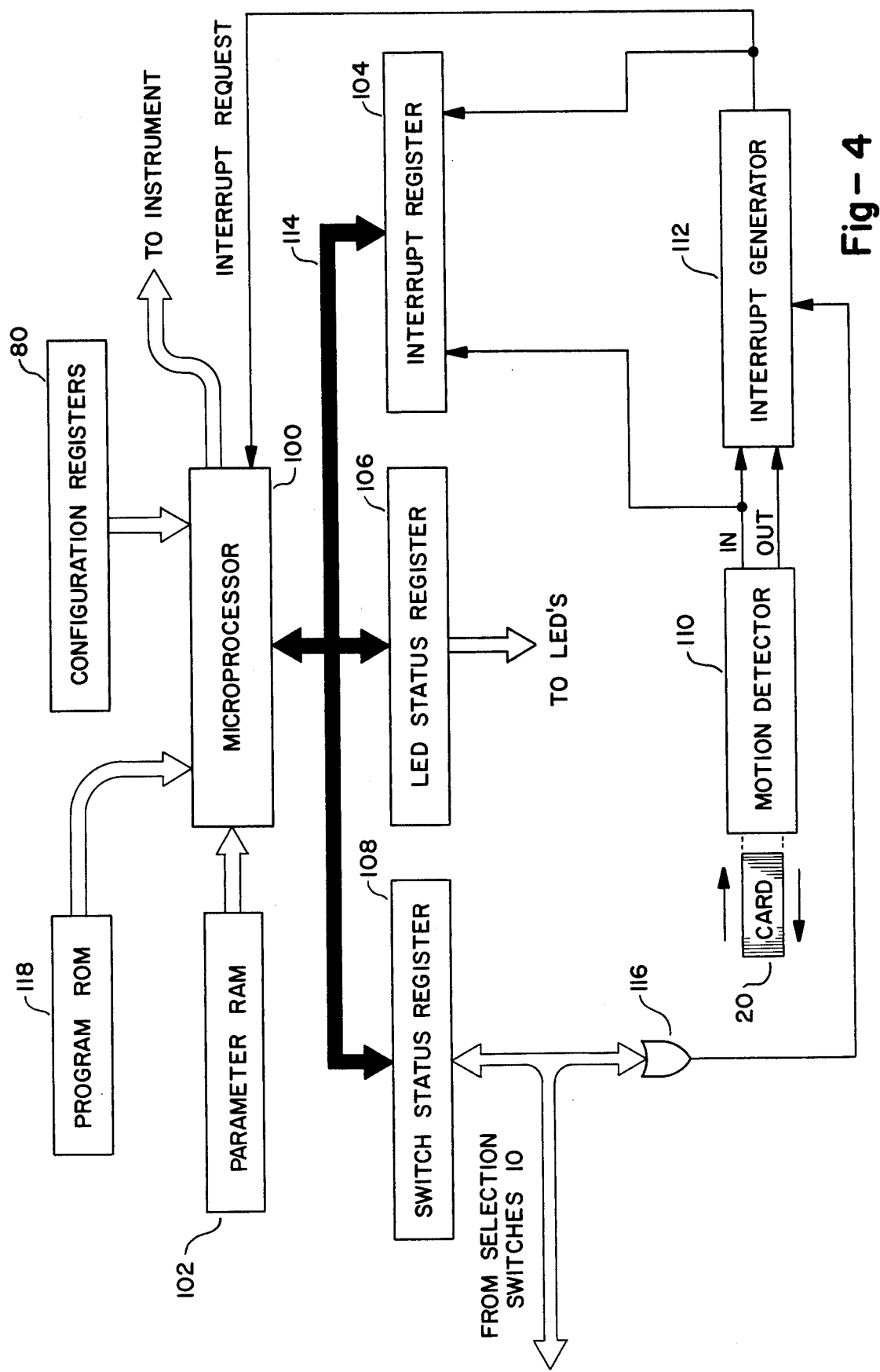

OPERATING PARAMETER SELECTION AND ENTRY DEVICE

BACKGROUND OF THE INVENTION

This invention is in the field of electronic insturments, more specifically devices for selecting user selectable functions or operating parameters of electronic instruments.

The conventional method of selecting instrument parameters is by using rotary switches, or the like, on the instrument front panel. Parameters that are changed less frequently may be changed by switches located on the instrument rear panel. Even less frequently varied parameters may be changed only by switches, straps, or jumpers located inside the instrument.

Some conventional instruments have, in addition to operators' manuals, a user information card which lists for the operator, among other things, the variable parameters of the instrument. This instruction card is usually attached in some manner to the instrument front panel.

SUMMARY OF THE INVENTION

In accordance with the preferred embodiment of the present invention, a user information card which also serves to check and/or change instrument parameters is added to an instrument.

The user information or operating parameter entry card contains information in the form of a matrix. It contains a printed list of the instrument operating parameters that are operator selectable. The card also has an indexing mark and a position encoding track. The electronic circuitry associated with the card includes motion detection circuits which read the position encoding on the card, circuits that interface the card to an intelligent controller or microprocessor, and memory devices for storing and recalling the instrument parameters.

By way of operation, the operator pulls the card out to the parameter he wishes to check or change. LED indicators display the currently active parameter in the matix row. If he wishes to change the active parameter, he depresses a switch associated with the new variable.

A major object of the present invention is to make an instrument easier to operate by reducing the number of front panel, rear panel, and internal switches.

Another object of the present invention is to reduce the number of times the operators' manual must be referred to in order to determine the operating parameter ranges.

A further object of the present invention is to provide a means for rapidly determining the status of system parameters.

Still a further object of the present invention is to provide a means for rapidly changing the system parameters.

The invention, however, both as to organization and method of operation, together with further advantages and objects thereof may best be understood by reference to the following description taken in connection with the accompanying drawings wherein like reference numerals refer to like elements.

BRIEF DESCRIPTION OF THE DRAWINGS

In the drawings:

FIG. 3 is a drawing of the user information card and the associated selection switches; and FIG. 4 is a block diagram of electronic circuitry associated with the preferred embodiment.

DETAILED DESCRIPTION OF THE INVENTION

Figures 1, 2:
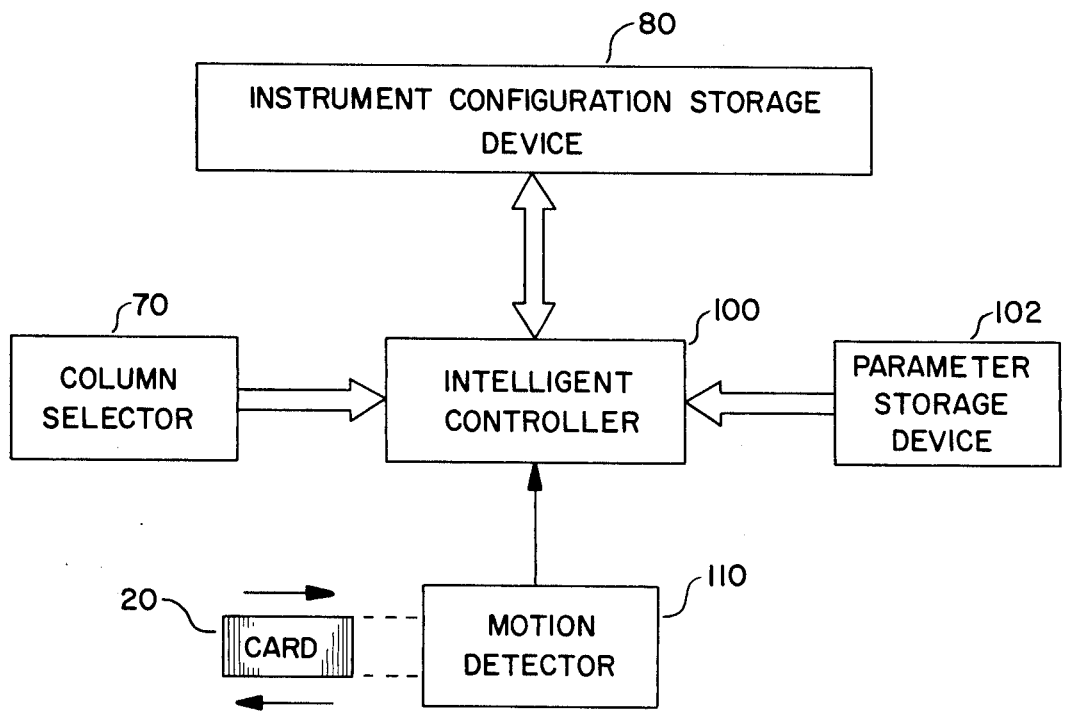
FIG. 1 is block diagram of the general configuration of the present invention.
FIG. 2 shows the arrangement of information on the users information card.

Shown in FIG. 1 is a general block diagram representing the present invention. Motion detector 110 is optically or otherwise coupled to operating parameter description carrying device 20 to detect the relative motion thereof. The relative motion of operating parameter description carrying device is presented to and processed by intelligent controller, or similar device, 100. Column selector 70 is also connected to intelligent controller 100 which processes the column information along with information obtained from operating parameter description carrying device 20 to select the corresponding parameter stored in parameter storage device 102. Instrument configuration storage device 80 temporarily stores the present instrument configuration which includes all of the presently selected parameters.

The information on the operating parameter description carrying device 20 is preferably arranged in the form of a matrix as shown in FIG. 2. The matrix consists of n columns by m rows of parameters.

In operation, device 20 is moved relative to a fixed-position motion detector. Device 20 is moved so as to select one of the rows (m) of the parameter matrix printed thereon. Located on device 20 is a position encoding track that permits its position to be detected by motion detector 110, converted to electrical signals, and coupled to intelligent controller 100. Column selector 70 contains switches in a one-to-one correspondence to the number of columns (n) in the parameter matrix. This row and column information is converted by intelligent controller 100 to the address of the memory location where the corresponding parameter is stored either in parameter storage device 102 or instrument configuration storage device 80. Storage devices 102 and 80 provide storage for all of the presently selected parameters.

FIG. 3 shows the preferred embodiment of the present invention. In this instance, it is a card for selecting the operating parameters of a plotter. User information card 20 moves in and out of housing 40. Mounted within housing 40 is a motion detector 110 which detects the direction of card movement by passing light through holes 50 along the edge of the card. Each switch 10 is used to select the column of the matrix on the card directly below it; that is, switch 10a selects matrix column 1 and switch 10h selects matrix column 8. Located behind each transparent switch 10 is a corresponding light-emitting diode (LED) 60. These LED's light to indicate which parameter in the row is currently active. Indicator LED 30 lights to warn the operator that card position has been lost.

In operation, if the operator wishes to check or change a system parameter, he merely pulls the user information card 20 out to the parameter row (m) containing the parameter he desired to check or change. The LED 60 above the column (m) corresponding to the active parameter (m,n) lights. He may now check to see if this is the setting he desires. If he wishes to select a new parameter in the present row, he merely presses the corresponding selector switch 10.

A block diagram of the electronic circuitry used to implement the preferred embodiment is present in FIG. 4. User information card 20 is optically coupled to motion detector 110. The outputs of motion detector 110, along with information from selection switches 10, are connected to interrupt generator 112 and interrupt register 104. Interrupt generator 112 is connected to the interrupt request line of microprocessor 100. Also connected to microprocessor 100, via a common data bus 114, are the previously mentioned interrupt register 104, the LED status register 106, and switch register 108. Microprocessor 100 also receives inputs from program read only memory (ROM) 118 and parameter random access memory (RAM) 102. Program ROM 118 contains microprograms for controlling microprocessor 100 and a set of all possible operator selectable instrument parameters. Parameter RAM 102 and configuration registers 80 contain a complete set of the presently selected parameters.

In operation, the motion of user information card 20 is detected by motion detector 110 which converts this motion to electrical signals. These signals indicate whether the card is moving into or out of housing 40. This motion detector may be constructed using a light source and photo-transistors or similar devices. The design of this type of motion detector is well known in the art, and consequently, it will not be described in detail here.

The output signals of motion detector 110 are connected to interrupt generator 112 which sends an interrupt request message to microprocessor 100. The interrupt generator may be constructed using sequential logic devices such as D-type flip-flops or the like. Also connected to interrupt generator 112, through OR gate 116, are the eight column selection switches 10. When card 20 is moved into or out of housing 40 or one of the selection switches 10 is pressed, interrupt generator 112 sends an interrupt request to microprocessor 100. Microprocessor 100 may be any commercially available type such as a M6800. Detailed discussion of the interconnection, operation, and programming of the microprocessor is not presented here because a detailed discussion of such units, including timing diagrams, block and extended block diagrams, details on reading data from or writing data in memory, flow charts, and signal descriptions, is given in the "M6800 Microprocessor Applications Manual" published in 1975 by Motorola, Inc. The microprocessor is also described in U.S. Pat. No. 3,962,682. Using the foregoing references, a person skilled in the art could design a microprocessor system to implement the present invention. To be compatible with microprocessor 100, register 80, RAM 102, and ROM 118 must be M6800 compatible devices.

When microprocessor 100 receives the above-mentioned interrupt request, it reads the contents of interrupt register 104 which may be any commercially available storage register such as a 74LS244. Register 104 contains data from which microprocessor 100, under program control, determines what type of interrupt has occurred and the required action.

The data in register 104 indicates whether the card was moved in or out or if one of the selection switches 10 were pressed. If the card was moved, the microprocessor steps to the memory location in parameter storage RAM 102 that corresponds to the matrix row the card was moved to and reads the information therein. It then enters this new information into LED status register 106 and lights the appropriate LED's corresponding to the newly selected parameter row. LED status register 106 may be any commercially available storage register such as a 74LS374. If, however, a selection switch was depressed, the microprocessor reads the data in switch status register 108 to determine which switch was pressed. Switch status register 108 may be any commercially available storage resiter or buffer such as a 74LS374 or 74LS244. Microprocessor 100 then retrieves from program ROM 118 the parameter data stored for the particular row and column of the parameter matrix. This data is used to update configuration register 80 and the microprocessor simultaneously instructs the instrument being controlled to implement the selected parameter. The microprocessor also updates parameter storage RAM 102 and LED status register 106.

In the preferred embodiment described here, parameter storage RAM 102 provides non-volatile memory. It includes a battery backup that maintains the contents of the memory for up to 90 days after the main instrument has been turned off. This eliminates the need for the operator to reenter all system parameters each time the system is turned on. Depending upon the amount of storage available in RAM 102 several complete configurations may be stored. These preselected setups may be selected instead of changing a large number of parameters each time a standard instrument setup is required.

While there has been shown and described a preferred embodiment of the present invention, it will be apparent to those skilled in the art that many changes and modifications may be made without departing from the invention in its broader aspects. For example, the user information card 20 may be a flexible sheet of material connected to a roller rather than a rigid card. Also card motion may be detected by means of magnetic stripes or the like. The appended claims are intended to cover all such modifications and changes that fall within the true spirit and scope of the invention.

The present invention is claimed in accordance with the following:

1. An operating parameter entry and display system for controlling the operation of an electronic apparatus by providing a means for selecting operating conditions, the system comprising:

a matrix of human-readable operating parameters recorded on a movable record member, said movable record member including motion encoding means thereon;

means for detecting motion of said movable record member and for producing electrical signals representing said motion;

a plurality of selection switches in one-to-one correspondence to the number of columns in said matrix for selecting one of said columns;

a switch status register for temporarily storing the status of said selection switches;

a parameter storage device for permanently storing, in electrical form, said matrix;

an interrupt register for storing data indicating whether said record member has been moved or one of said plurality of selection switches has been pressed;

a programmable controller for interrogating said switch status register and said interrupt register to determine which operating parameter is to be retrieved from said parameter storage device for controlling the operation of the electronic apparatus; and an interrupt generator coupled to said motion detection means to receive said electrical signals and to generate therefrom an interrupt request signal for interrupting said programmable controller, said interrupt generator also being coupled to said plurality of selection switches for receiving electrical signals indicating which one of said plurality of selection switches has been selected.

2. The system of claim 1, wherein said programmable controller comprises a microprocessor.

3. The system of claim 1, wherein said movable record member comprises a card.

4. The system of claim 3, wherein said card includes indexing means for indicating the first row of said matrix.

5. The system of claim 3 further comprising a housing within which said motion detection means is fixedly mounted and said card is moved in and out of a slot in said housing.

* * * * *